(12) United States Patent
Schott et al.

(10) Patent No.: US 7,463,044 B2
(45) Date of Patent: Dec. 9, 2008

(54) ADAPTER FOR POSITIONING OF CONTACT TIPS

(75) Inventors: Steffen Schott, Dresden (DE); Stefan Kreissig, Venusberg (DE); Axel Becker, Dresden (DE); Dietmar Runge, Grosserkmanndorf (DE)

(73) Assignee: SUSS Microtec Test Systems GmbH, Sacka (DE)

( * ) Notice: Subject to any disclaimer, the term of this patent is extended or adjusted under 35 U.S.C. 154(b) by 1 day.

(21) Appl. No.: 11/531,092

(22) Filed: Sep. 12, 2006

(65) Prior Publication Data

US 2007/0296402 A1  Dec. 27, 2007

(30) Foreign Application Priority Data

Jun. 27, 2006 (DE) .................. 20 2006 010 086

(51) Int. Cl.
*G01R 31/02* (2006.01)
(52) U.S. Cl. ....................... 324/758; 324/754
(58) Field of Classification Search ........... 324/754, 324/158.1, 758
See application file for complete search history.

(56) References Cited

U.S. PATENT DOCUMENTS

| | | | |
|---|---|---|---|
| 3,757,216 A * | 9/1973 | Kurtin et al. ................ 324/149 |
| 4,971,159 A | 11/1990 | Boll et al. | |
| 5,389,873 A * | 2/1995 | Ishii et al. ................ 324/158.1 |
| 5,568,056 A * | 10/1996 | Ishimoto .................... 324/754 |
| 5,574,668 A * | 11/1996 | Beaty ........................ 702/150 |
| 5,621,333 A * | 4/1997 | Long et al. .................. 324/762 |
| 6,034,524 A * | 3/2000 | Barringer et al. ......... 324/158.1 |
| 6,075,373 A * | 6/2000 | Iino .......................... 324/754 |
| 6,259,261 B1* | 7/2001 | Engelking et al. .......... 324/754 |
| 6,307,386 B1* | 10/2001 | Fowler et al. .............. 324/754 |
| 6,308,728 B1* | 10/2001 | Frazier ..................... 137/312 |
| 6,794,888 B2* | 9/2004 | Kawaguchi et al. ......... 324/754 |
| 6,856,152 B2* | 2/2005 | Hidehira ................... 324/754 |
| 6,957,405 B2* | 10/2005 | Saunders et al. ............. 716/4 |
| 7,386,816 B2* | 6/2008 | Saunders et al. ............. 716/4 |
| 2004/0008044 A1* | 1/2004 | Hohenwarter .............. 324/754 |

* cited by examiner

*Primary Examiner*—Ha Nguyen
*Assistant Examiner*—Richard Isla Rodas
(74) *Attorney, Agent, or Firm*—Heslin Rothenberg Farley & Mesiti P.C.

(57) ABSTRACT

An adapter for positioning of contact tips has a location surface for locating a contact tip and a base element with a base for setting the adapter on a mounting surface. A positioning element is in mechanical contact with and mobile relative to the base element. The location surface can be positioned relative to the base, in at least one positioning direction, by the positioning element which includes a gearing for converting rotary movement to translational movement in the positioning direction.

13 Claims, 4 Drawing Sheets

ADAPTER FOR POSITIONING OF CONTACT TIPS

BACKGROUND ART

The invention relates to an adapter for positioning of contact tips. The adapter has a location surface for locating a contact tip as well as a base element with a base. This base is used for setting the adapter on a mounting surface. A positioning element that is mobile relative to the base element is in mechanical contact with the base element so that the location surface can be positioned relative to the base in at least one direction by means of the positioning element.

Adapters of this kind are used for precise positioning of all varieties of contact tip which, according to their application, establish a locally restricted electrical, mechanical or thermal contact with a component. This kind of precise contacting is necessary in all varieties of applications, in particular microelectronics.

Positioning mechanisms that use micrometer screws or X-Y cross tables are known there in particular for positioning of probe tips on the contacts of semiconductor components to be tested. Although such position mechanisms allow highly precise positioning, they are not suitable for continuous flow testing in ongoing production in terms of their time requirement for each individual positioning, their space requirement and their costs. Such complex mechanisms are not always needed where one-off positioning of one or more contact tips relative to a fixed point is carried out and is used for a large number of identical contact tips in that the components to be contacted are positioned with a high level of reproducibility relative to this fixed point.

As several contacts are to be established simultaneously in most applications when testing semiconductor components, including on an industrial scale, and these contacts have a defined position in relation to each other, the positioning of the contact tips in relation to each other is particularly important in these cases. For this purpose, the contact tips are fixed on probe cards in the corresponding position in relation to each other, and these probe cards are used in isolation or on the wafer in the testing arrangement relative to the mounting of the component to be tested. For industrial production testing, the individual probe tips and the probe cards are standardised for the various applications, in particular high-frequency (HF) and direct current (DC) probe tips. The probe cards are mostly disc-shaped insulation carriers that are equipped with the necessary components and devices for electrical contacting of the probe tips and with a mechanically stable, mostly metallic supporting ring for installation in the testing station.

The probe tips are mounted on the probe cards with suitable adapters, mostly in the form of simple geometric dies or base plates, and positioned relative to each other. This assembly does not allow subsequent adjustment of the position. If fingerlike DC probe tips are assembled in this way, adjustment of the tips relative to each other is possible to a limited extent by bending the probe tips. However, if comb-shaped HF probe tips are used, the shape of the tips precludes this possibility, and assembly itself can only be performed with a high degree of precision, mostly only on specially equipped workstations. As the necessary mechanical contacting causes a high level of wear in continuous flow testing, this procedure must be performed regularly for renewing the probe tips, involving a large amount of time and expenditure.

U.S. Pat. No. 4,971,159 describes a micropositioner in which, depending on the number of necessary positioning directions, a corresponding number of plates are arranged, each of which are moved against each other in the corresponding direction. The moving of an individual plate is effected by means of a mechanical impulse of a piston based on the necessary movement, which piston is arranged in a mobile manner in a cylinder and is moved by means of pressurised air. As a result of the fixed connection of the cylinder with the respective plate, the impulse is transferred to the plate. One disadvantage here is the need for a pneumatic system with the corresponding number of separate connections and a complex, separate or adjustable channel route up to each piston. The space requirement for the cylinder and the piston, which must always have a minimum dimension and be moveable along a minimum distance in order to generate the necessary impulse, is obstructive. This particularly applies if a large number of probe tips are to be placed next to each other on a probe card.

BRIEF SUMMARY OF THE INVENTION

One aspect of the invention is therefore to provide a positioning system of the aforementioned kind with which contact tips can be positioned precisely in a fixed end position in a manageable, space-saving, independent and low-cost manner.

This aspect is firstly achieved by means of a positioning system that has the characteristics of claim 1. Advantageous embodiments of this positioning system can be found in the claims that refer back to claim 1.

The term for the "gearing", with which the location surface is moved according to the invention, is to be understood here in line with its general meaning as a mechanism for converting movements, i.e. for guiding parts on a defined motion path. By tapping the translational movement that is needed to position the location surface and, via its connection with the contact tip, to position the contact tip, from the rotating drive section by means of a suitable sampler and transmitting it to a translation element by means of a coupling element, the necessary precision is attainable through the corresponding design of the gearing and both motion sequences can be realised in a very small space.

In accordance with the spatial conditions, the size of the area in which the contact tip is to be positioned and the force to be transmitted that is necessary to move the contact tip including the connection means with the positioning element, different types of gearing with the above-mentioned function can be used. One advantage here is that a limited distance is to be overcome only at the time of positioning and no continuous movement is to be realised. The necessary temporary rotational movement can be triggered in accordance with the gearing used in a wide variety of ways, in the simplest case by means of a non-recurring, purely mechanically triggered rotation of the drive section, for example a screw, so that the positioning element forms a self-contained unit without the need for media connections.

If the set position (end position) of the contact tip is to be maintained for a defined period and/or a force is to be exerted on the contact tips that is suitable for moving the contact tip from this position, the end position can be fixed by means of suitable elements in accordance with an embodiment of the adapter. The elements for fixing are to be adapted in accordance with the forces produced and the complexity of the adapter.

The object according to the invention is also achieved by means of an adapter that comprises the features according to claim 2. Advantageous embodiments can in turn be found in the claims that refer back to claim 2. This adapter according to the invention also enables positioning of the location surface of the adapter and therefore of a contact tip mounted on the location surface by means of a simple mechanical actuation capability with which the extension arm is changed in terms of its deflection and then fixed in the new position. However, deflection can also be carried out by means of a magnetic or electrical field.

Depending on the shape of the extension arm, one-dimensional or two-dimensional positioning is possible with this adapter. With a tongue-shaped extension arm that, depending on the shape, has a fixed and a free edge or corner, deflection is, for example, only possible in one direction, that of the surface normals. In contrast, a rod-shaped extension arm allows two-dimensional deflection and positioning. The arrangement of an extension arm relative to the base is possible in accordance with the necessary positioning direction so that movement in the x, y or z direction or a corresponding combination of two directions can be attained with the extension arm.

The shape of the extension arm depends on factors including the contact tip to be located, so that the extension arm in the standardised HF or DC probe tips used for component testing with a longitudinally extended fastening surface, for example, is tongue-shaped.

To allow three-dimensional positioning of the location surface, according to particularly advantageous embodiments of the invention, it is possible to combine several gearings for each direction of an adapter or one or two gearings with an extension arm in an adapter. As a result of the compact and easily operable form of gearing and extension, a combination of the two also has the described advantages.

It has proved to be particularly advantageous that the positioning of a contact tip can be carried out on site by the user with the adapter according to the invention independently of the embodiment described above with no special aids and the geometric design of the adapter itself allows such degrees of freedom that it can be adapted to all kinds of contact tips and to all kinds of mounting surfaces, for example standardised probe cards, without impeding the necessary electrical contacting of the contact tips or mechanical load shedding of the leads.

A further advantage is the opportunity to provide a separate adapter even in a very small space for every contact tip so that the contact tips can be positioned in relation to each other individually. The combination of the described embodiments also makes it possible to position several tips jointly in one positioning direction and, additionally, to position them separately from each other.

In accordance with a further embodiment of the adapter, the angle between the base and the location surface can be changed and fixed by means of torsion of the extension arm so that, depending on the shape of the extension arm, a defined rotation or a defined angle of the contact tip can be set in relation to its axis or in relation to the base of the adapter. Insofar as the torsion of the extension arm serves the purpose of levelling the contact tip, the torsion of the extension arm should be approximately 0 to 3° according to an embodiment of the invention.

Insofar as an additional positioning direction is to be set with an additional gearing with the adapter, it proves to be favourable if the positioning element is designed in two pieces. In this way, it is possible to position the entire positioning element relative to the base of the base element in one direction with the first gearing and to position one part of the positioning element relative to the other and therefore relative to the base in the other direction with the second gearing. This embodiment also has the advantageous properties described above in terms of design, ease of operation and combination capability of the different variants of the adapter.

The aspect is particularly achieved by an adapter that has an eccentric with at least one guide element for guiding the movement of the location surface in the respective positioning direction as a gearing for converting a rotatory movement to a translational movement. The need for a movement of the contact tip that is limited in terms of time and space for positioning thereof allows this simple design.

As a drive section, different designs are possible that have an eccentric structure in terms of the rotation axis, for example a pin arranged outside the rotation axis or a disc whose centre is outside the rotation axis. There are also various possibilities as a sampler for tapping the movement. For example, a defined, linear slot design in the translation section is conceivable into which the drive section engages, or a linear edge of the translation section that is pressed onto the drive section by means of a return element, e.g. a screw.

The guide that the positioning element has in this embodiment forces the translation section into the requisite direction of movement. In the simplest case, this guide can consist of one or more slots in which one or more pins run. The precision of the direction of movement can be improved through the arrangement of two guide elements.

Depending on whether the positioning element has one gearing or an additional one, the described translation section is the entire positioning element or part of it. The movement of the translation section into the requisite positioning direction is carried out with the described adapter through simple rotation of the eccentric. This can be initiated mechanically or electrically.

For many applications, particularly in microelectronics, it is sufficient and particularly favourable for the design of an adapter according to the object if the positioning element realises movements of the location surface relative to the base in the range up to 5 mm, preferably up to 1 mm. For motion sequences of this application in a larger range, as described above, the more complex positioning mechanisms to be operated under laboratory conditions are mostly used, with the corresponding dimensioning of the gearing or extension arm also making it possible to use the adapter according to the invention.

As a result of the described simple, compact construction and the low laterally acting forces that are produced during positioning compared with the described positioning mechanism according to the state of the art due to application of the gearing and/or the extension arm, it is possible to fasten the adapter on a mounting surface by means of vacuum suction or magnetic attachment in addition to the known mechanical mounting methods using screws or clamps. Crucial factors for the type of mounting are firstly the forces produced and secondly the material and shape of the adapter as well as the design and freedom of assembly of the mounting surface. If the possibility of connection to a vacuum source and sufficiently even fitting surfaces are present, suction of the adapter can be carried out particularly easily.

BRIEF DESCRIPTION OF THE DRAWING FIGURES

The invention is explained in further detail below on the basis of an execution example. In the associated drawing, FIG. 1 shows a perspective view of an adapter according to the invention;

DETAILED DESCRIPTION

Figure 1:
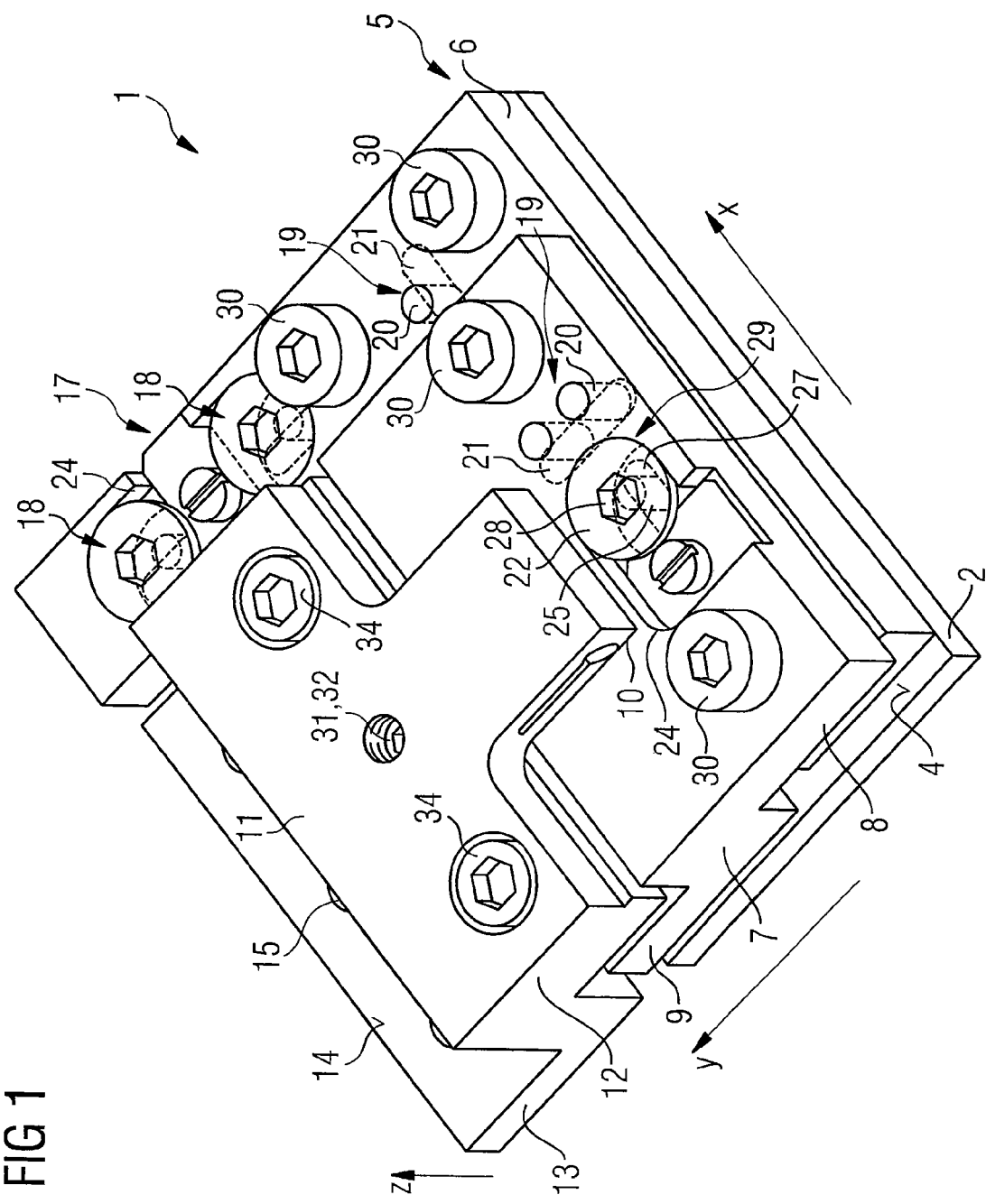
Figure 2:
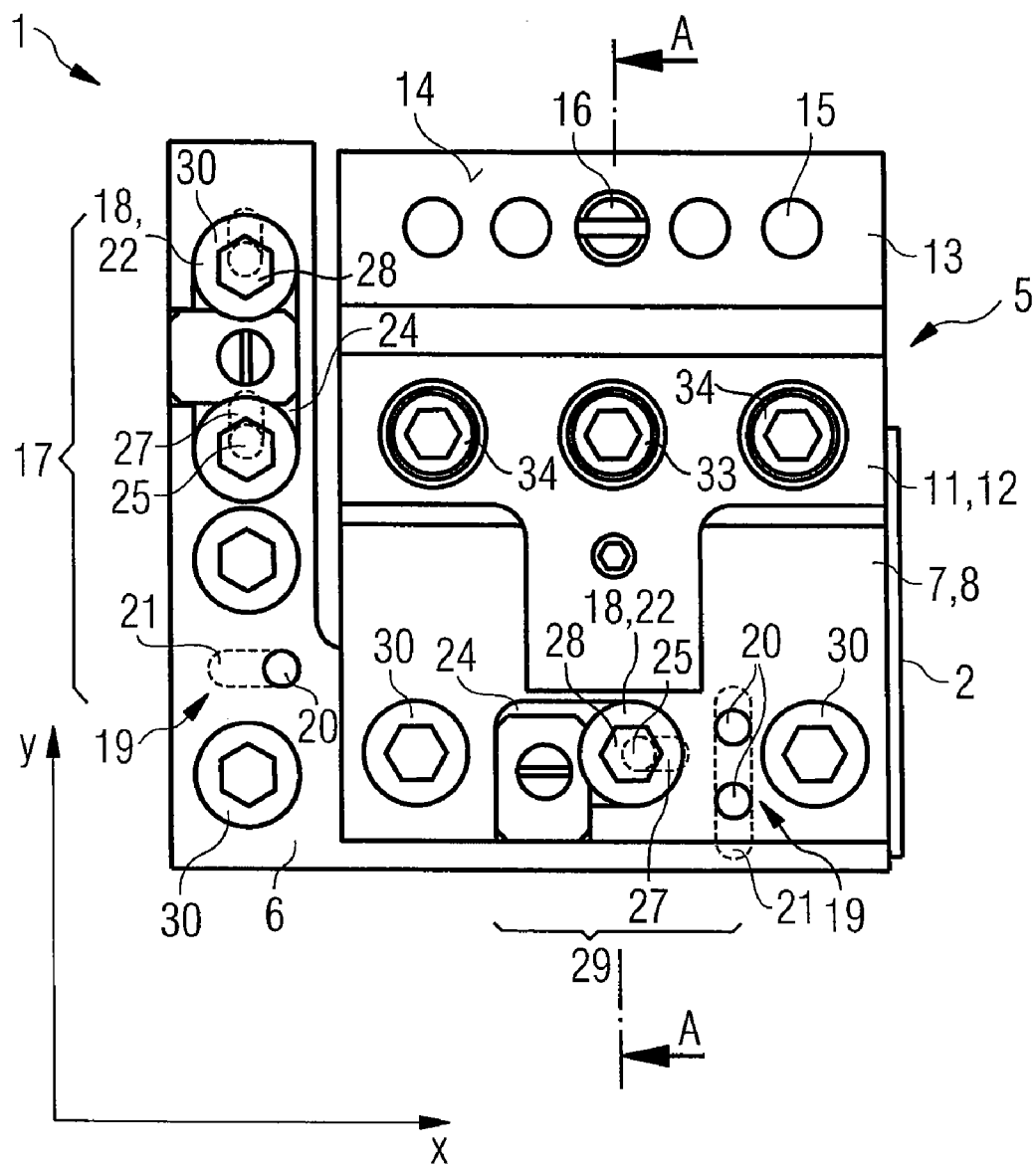
FIG. 2 shows a top view of an adapter according to FIG. 1 in a mirror-image execution.

The adapter 1 according to the invention according to FIG. 1 and FIG. 2 comprises a base element 2 in the form of a flat plate with an even base 3. The positioning element 5 is mounted on the even top surface 4 of the base element 2, which top surface is parallel to the base.

The positioning element 5 is designed in two pieces and consists of a bottom section 6 and a top section 7. The bottom section 6 largely consists of an L-shaped plate that rests on the base plate 2 with the entire surface of its even underside. The top section 7 rests on a rectangular partial surface of the bottom section 6 with a segment. The top section 7 consists of a stepped main body whose top horizontal step 8 rests on the bottom section 6 with its entire surface. The stepped shape of the top section 7 is formed in such a way that the remaining surface that faces the bottom section 6 and the base element 2 maintains an equal distance from the bottom section 6 and the base element 2. This distance ensures movement of the top section 7 relative to the bottom section 6 and is dimensioned in accordance with the freedom of movement required for positioning in the two horizontal directions (x and y directions). The adapter 1 shown realises positionings in the range up to 1 mm in each of the three directions of movement.

An extension arm 11, also stepped, is attached on the horizontal top side of the top step 8 of the top section. The extension arm 11 is connected with the top section 7 along a narrow, longitudinally stretched joining surface 10 in the central third of the top side of the top section, the connection being designed as a material joint that ensures movement of the extension arm 11 in the z direction. The extension arm 11, with its surface facing the top section 7, replicates the stepped shape of the top section 7 and has an almost consistent distance to the top section 7 along this entire surface. This distance ensures the deflection of the extension arm 11 in the vertical direction (z direction) in relation to the base 3 of the adapter 1 and is also dimensioned in accordance with the freedom of movement required in this direction. The lowermost horizontal surface of the stepped extension arm 11 runs parallel to the base 3 of the adapter 1 and ends at a distance therefrom that is less than the height of the base element 2. This distance also ensures the displacement of the extension arm 11 and is dimensioned accordingly.

The horizontal top side of the bottom step 13 of the extension arm, which runs parallel to the base 3 of the base element 2, serves as the location surface 14 for locating the contact tip 40, 41. For fastening the contact tip 40, 41, this step of the extension arm 11 has drilled holes 15 and/or screws 16 (FIG. 2) which help give the contact tip 40, 41 screw-on capability. The number and distribution of the drilled holes 15 and/or screws 16 are adapted to the design of a contact tip 40, 41 that is not shown.

The positioning of the location surface 14 relative to the base 3 can be realised with the shown adapter 1 in the x, y and z direction. For this purpose, the positioning element 5 is arranged on the base plate 2 in a shiftable manner and the top section 7 of the positioning element 5 is shiftable on the top section 6 thereof.

For shifting the positioning element 5, a first gearing 17, consisting of two eccentrics 18 and a guide element 19, is arranged. These are designed in such a way that the actuation of both eccentrics 18 generates a shift of the positioning element 5 in the x direction as marked in FIG. 1 and FIG. 2. Both eccentrics 18 consist of an eccentric disc 22, each of which are inserted in a notch 24 in the bottom section 6 of the positioning element 5 and on the bottom side of which a cylindrical eccentric pin 25 is attached whose axis 26 is offset in relation to the axis of the eccentric disc 23 in the y direction. As shown in FIG. 2, the offset of both eccentric pins 25 is identical in terms of direction and amount. Corresponding to each of the two eccentric pins 25, an eccentric slot 27 with a width according to the pin diameter is arranged in the base element 2 so that each eccentric pin 25 engages in an eccentric slot 27. Both eccentric slots 27 realise the freedom of movement of the eccentric pins 25 of the first gearing 17 in the y direction during rotation of the eccentric discs 22. Both eccentric discs 22 have on their top side a hexagonal recess 28 into which a tool for rotating the eccentric disc 22 can engage.

The guide element 19 of the bottom section 6 of the positioning element 5 consists of a guide pin 20, which is set into the bottom section 6 of the positioning element 5 and engages in a corresponding guide slot 21 in the base element 2.

As a result of simultaneous rotating of the two eccentric discs 22, both eccentric pins 25 define a circular movement. Whereas the y component of this circular movement does not lead to any movement of the positioning element 5 through the eccentric slots 27 that run in the y direction, the positioning element 5 follows the x component as a result of the course of the guide slot 21 in the x direction. The distance that can be covered in this direction with the described eccentrics equates to twice the offset between the eccentric pin axis and eccentric disc axis 26, 23, i.e. the diameter of the circular movement of each eccentric pin 25, plus the diameter of the eccentric pin 25 itself.

The arrangement of two eccentrics 18 to be operated simultaneously can stabilise the movement and increase the positioning precision.

The top section 7 is shiftable in the y direction in relation to the bottom section 6 by means of a second gearing 29, consisting of an additional eccentric 18 and an additional guide element 19. The eccentric 18 of the top section 7 is structurally identical to those of the bottom section 6, except that the alignment of its eccentric slot 27 and its guide slot 21 is adapted to the positioning direction of the top section 7, i.e. the eccentric slot 27 runs in the x direction and the guide slot 21 runs in the y direction. As a result of the fitting of the eccentric disc 22 into a notch 24 of the top section 7 and the formation of the eccentric slot 27 as well as the guide slot 21 in the bottom section 6 of the positioning element 5, the top section 7 is shifted relative to the bottom section 6 through rotation of this eccentric 18. To stabilise this movement, the additional guide element 19 contains two guide pins 20 that engage in the same guide slot 21.

Both the bottom section 6 and the top section 7 of the positioning element 5 have two locking screws 30 that are arranged next to the eccentrics 18 and the guide elements 19 and help make each set position fixable.

The positioning of the location surface 14 in the z direction by means of the extension arm 11 is carried out through displacement of the extension arm 11 from its rest position or a fixed starting position. By means of an adjusting element 31 in the form of a grub screw 32, which presses against the horizontal surface of the bottom step of the top section 9 as a result of screwing into a drilled hole 15 with the thread in the top step of the extension arm 12, the extension arm 11 is moved in the positive z direction. The displacement in the opposite z direction is effected through simultaneous tightening of two jack screws 34 that are arranged symmetrically either side of the adjusting element 31 and screwed into the bottom step of the top section 9. The position is fixed here by means of the adjusting element 31.

The adjusting element 31 is arranged on the axis of symmetry of the extension arm 11 so that, by means of the two jack screws 34, the angle of the extension arm 11 and therefore that of the location surface can be changed in relation to the base 3 due to partial, opposing tightening and loosening of both jack screws 34. The opposing tightening and loosening of the jack screws 34 effects torsion of the extension arm 11 around its axis of symmetry in accordance with the existing distance between the extension arm 11 and the top section 7. At the same time, the extension arm 11 is fixed in its z position.

The adapter 1 shown in FIG. 2 is designed in a similar manner to the one in FIG. 1, but in a mirror image thereof, with the axis of reflection corresponding to the axis of symmetry of the extension arm 11 and being represented by the axis of intersection A-A in FIG. 2. This mirror-image design enables the arrangement of both adapters 1 with the sides facing away from the first joint 18 directly next to each other. Through a corresponding redesign of the base 3 and the bottom section 6 of the positioning element 5, the first joint 18 can be arranged in such a way that a whole series of adapters 1 can be arranged next to each other in a very small space.

The adapter 1 according to FIG. 2 shows a possible variation of the adjusting element 31 and the jack screws 34 as well as the fastening for the contact tip 40, 41 on the location surface 14.

In the embodiment shown, the adjusting element 31, in addition to the grub screw 32, which presses against the top step of the top section 8 here, comprises an additional locking screw 33, with both screws 32, 33 being arranged on the axis of symmetry of the extension arm 11. Both jack screws 34 are arranged on both sides next to the locking screw 33 and symmetrical thereto.

Figure 3:
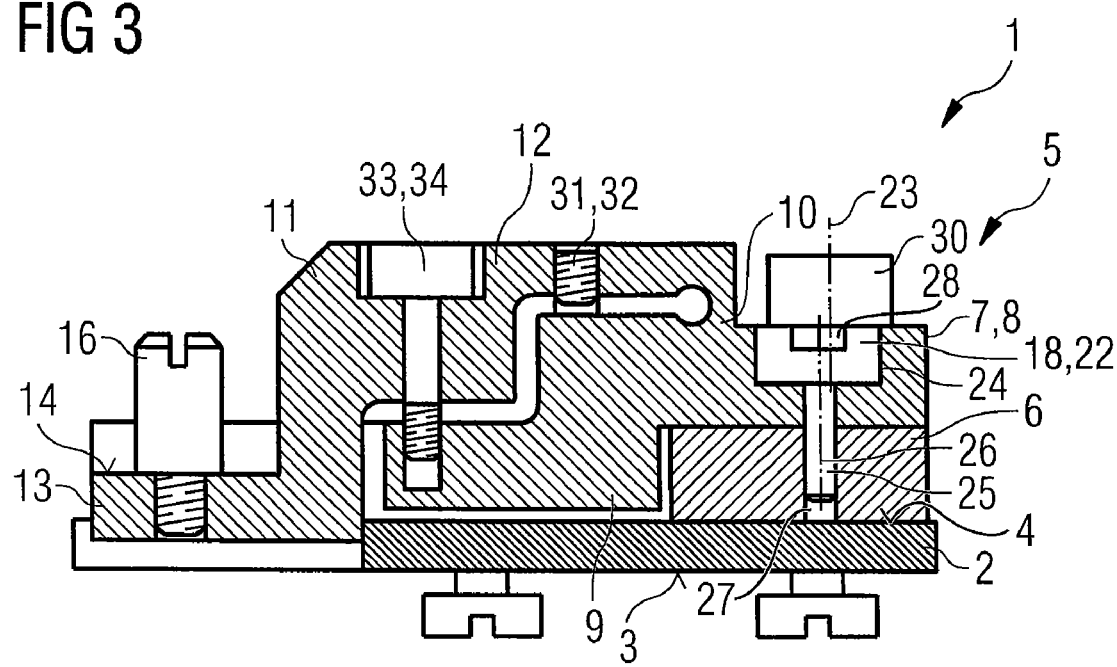
FIG. 3 shows a cross-section view of the adapter according to FIG. 2, along the line of intersection A-A.
Figure 4:
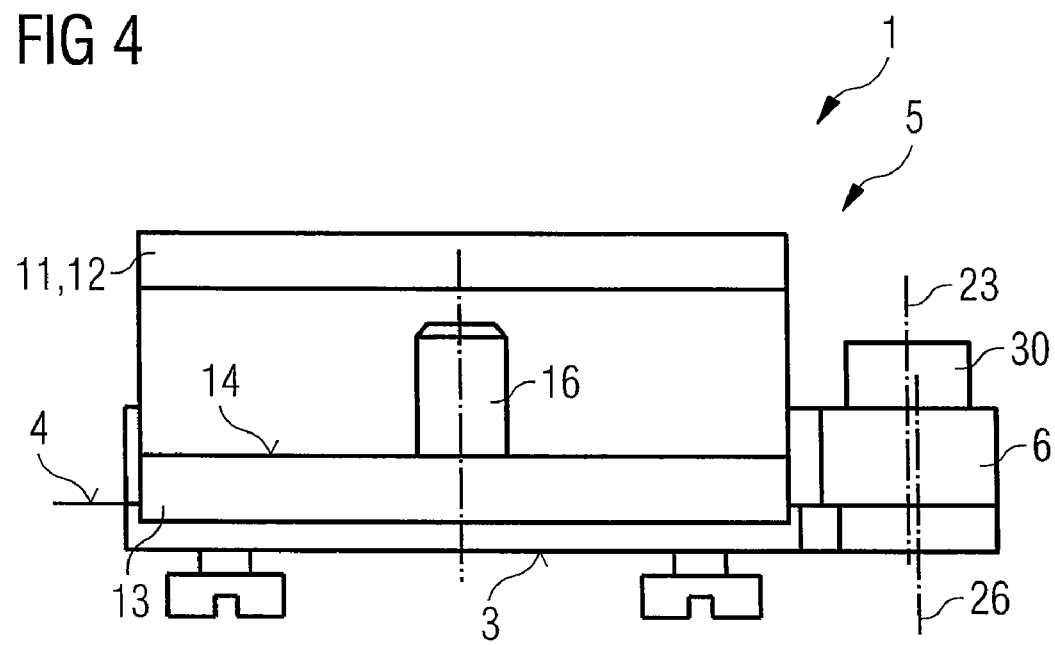
FIG. 4 shows a side view of the adapter according to FIG. 2.

In FIG. 3, in which the adapter 1 according to FIG. 2 is shown in cross-section according to the line of intersection A-A, the offset of the axis of the eccentric disc 23 to the axis of the eccentric pin 26 of the second gearing 29 is shown. FIG. 4, a side view of the adapter 1 according to FIG. 2, shows the offset of the axis of the eccentric disc 23 to the axis of the eccentric pin 26 of the first gearing 17.

Figure 5:
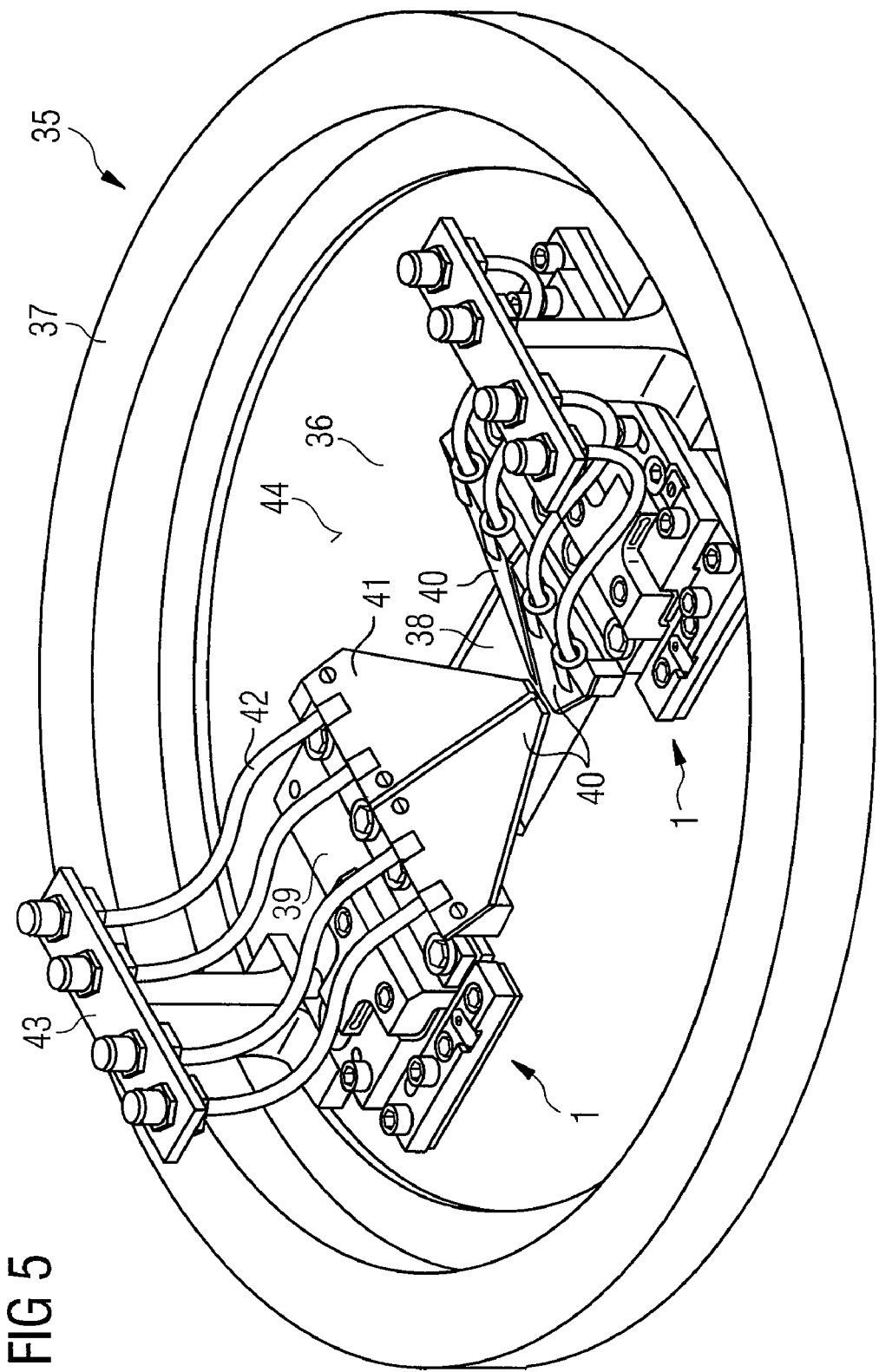
FIG. 5 shows a perspective view of a probe card with four contact tips and three adapters according to the invention.

FIG. 5 shows the adapter 1 according to the invention, installed in a probe card 35 that is used for testing semiconductor components on the wafer. The probe card 35 consists of an insulation carrier 36 and a supporting ring 37. The insulation carrier 36, which acts as the mounting surface 44 for the adapter, has a central, rectangular opening 38 through which contact tips 40, 41 can contact the semiconductor components.

By means of three adapters 1 and an attachment 39, three positionable contact tips 40 and a fixed contact tip 41 can be mounted on the probe card 35. The three positionable contact tips 40 are positioned by means of the adapter 1 according to FIG. 1 or 2 relative to the fixed contact tip 41 in this position and in such a way that the four tips 40, 41 can jointly contact a repeating contacting pattern of the semiconductor elements many times in that after the first contacting, a wafer that is not shown in more detail is shifted in accordance with the pitch in which the semiconductor components are arranged thereon relative to the probe card 35 and fed to the contact tips 40, 41.

The contact tips 40, 41 can be electrically contacted by means of electrical leads 42. To avoid disturbing the positioning of the contact tips 40 through mechanical voltages of the leads 42, the leads 42 are mechanically fixed free of tension by means of strain-relief clamps 43.

Adapter for Positioning of Contact Tips

Key

1 Adapter
2 Base element
3 Base
4 Top surface
5 Positioning element
6 Bottom section
7 Top section
8 Top step of the top section
9 Bottom step of the top section
10 Joining surface
11 Extension arm
12 Top step of the extension arm
13 Bottom step of the extension arm
14 Location surface
15 Drilled hole
16 Screw
17 First gearing
18 Eccentric
19 Guide element
20 Guide pin
21 Guide slot
22 Eccentric disc
23 Axis of the eccentric disc
24 Notch
25 Eccentric pin
26 Axis of the eccentric pin
27 Eccentric slot
28 Recess
29 Second gearing
30 Locking screws
31 Adjusting element
32 Grub screw
33 Additional locking screw
34 Jack screw
35 Probe card
36 Insulation carrier
37 Supporting ring
38 Central opening
39 Attachment
40 Positionable contact tip
41 Fixed contact tip
42 Lead
43 Strain-relief clamp
44 Mounting surface

The invention claimed is:

1. An adapter for positioning of contact tips, comprising a location surface for locating a contact tip, a base element with a base for setting the adapter on a mounting surface and a positioning element in mechanical contact with the base element and mobile relative to the base element so that the location surface can be positioned relative to the base in at least one positioning direction by the positioning element, and wherein the positioning element has at least a first gearing for converting a rotatory movement to a translational movement, and direction of the translational movement corresponds to the positioning direction, and wherein the positioning element has an extension arm of which a degree of freedom has a direction that deviates from the positioning direction of the gearing and wherein the gearing comprises at least one eccentric mechanism with at least one guide element for guiding the movement of the location surface along the positioning direction, and wherein each eccentric mechanism comprises an eccentric disc and an eccentric pin, the eccentric pin coupling to the eccentric disc and having an axis offset from an axis of the disc.

2. The adapter according to claim 1, wherein an end position of the location surface is fixable.

3. The adapter according to claim 1, wherein the positioning element has an extension arm with a fixed first end and a free second end, of which a degree of freedom corresponds to the positioning direction, and an end position of the free end of the extension arm is fixable.

4. The adapter according to claim 3, wherein an angle between the base and the location surface can be changed by torsion of the extension arm and fixed by the torsion of the extension arm.

5. The adapter according to claim 4, wherein the torsion of the extension arm is in a range up to 3°.

6. The adapter according to claim 1, wherein the positioning element can be positioned in an other positioning direction by being formed in two pieces and having a second gearing for converting a rotatory movement to a second translational movement, and direction of the second translational movement corresponds to the other positioning direction.

7. The adapter according to claim 1, wherein the positioning element realizes movements of the location surface relative to the base in a range up to 5 mm.

8. The adapter according to claim 1, wherein the positioning element realizes movements of the location surface relative to the base in a range up to 1 mm.

9. The adapter according to claim 1, wherein the adapter is fastened on the mounting surface by suction or by screws or by clamps or by magnetic attachment.

10. An adapter for positioning of contact tips, comprising a location surface for locating a contact tip, a base element with a base for setting the adapter on a mounting surface and a positioning element in mechanical contact with the base element and mobile relative to the base element so that the location surface can be positioned relative to the base in at least one positioning direction by the positioning element, and the positioning element has at least a first gearing for converting a rotatory movement to a translational movement, and direction of the translational movement corresponds to the positioning direction, and wherein the gearing comprises at least one eccentric mechanism with at least one guide element for guiding the movement of the location surface along the positioning direction, and wherein each eccentric mechanism comprises an eccentric disc and an eccentric pin, the eccentric pin coupling to the eccentric disc and having an axis offset from an axis of the disc.

11. The adapter according to claim 10, wherein the gearing comprises multiple eccentric mechanisms for guiding movement of the location service along the positioning direction.

12. The adapter according to claim 10, wherein the positioning element can be positioned in an other positioning direction by being formed in two pieces and having a second gearing for converting a rotatory movement to a second translational movement, and direction of the second translational movement corresponds to the other positioning direction.

13. The adapter according to claim 10, wherein the adapter is fastened on the mounting surface by suction or by screws or by clamps or by magnetic attachment.

* * * * *